(12) United States Patent
Li

(10) Patent No.: US 9,570,606 B2
(45) Date of Patent: Feb. 14, 2017

(54) FINFET LDMOS DEVICE AND MANUFACTURING METHODS

(71) Applicant: SEMICONDUCTOR MANUFACTURING INTERNATIONAL (SHANGHAI) CORPORATION, Shanghai (CN)

(72) Inventor: Yong Li, Shanghai (CN)

(73) Assignee: Semiconductor Manufacturing International (Shanghai) Corporation, Shanghai (CN)

(*) Notice: Subject to any disclaimer, the term of this patent is extended or adjusted under 35 U.S.C. 154(b) by 0 days.

(21) Appl. No.: 14/839,917

(22) Filed: Aug. 28, 2015

(65) Prior Publication Data

US 2016/0093730 A1  Mar. 31, 2016

(30) Foreign Application Priority Data

Sep. 26, 2014 (CN) .......................... 2014 1 0499784

(51) Int. Cl.
*H01L 29/78* (2006.01)
*H01L 29/66* (2006.01)
*H01L 29/06* (2006.01)
*H01L 29/165* (2006.01)

(52) U.S. Cl.
CPC ....... *H01L 29/7816* (2013.01); *H01L 29/6681* (2013.01); *H01L 29/66545* (2013.01); *H01L 29/66681* (2013.01); *H01L 29/66795* (2013.01); *H01L 29/7835* (2013.01); *H01L 29/7851* (2013.01); *H01L 29/0653* (2013.01); *H01L 29/165* (2013.01); *H01L 29/7848* (2013.01)

(58) Field of Classification Search
CPC .......... H01L 29/78; H01L 29/10; H01L 29/66; H01L 29/7835; H01L 29/66659; H01L 29/0653; H01L 29/7816; H01L 29/66545; H01L 29/66681; H01L 29/41758; H01L 29/6681; H01L 29/7831
USPC ................................................. 257/335, 345
See application file for complete search history.

(56) References Cited

U.S. PATENT DOCUMENTS

| | | | |
|---|---|---|---|
| 2012/0119265 A1* | 5/2012 | Su | H01L 29/0847 257/288 |
| 2013/0126979 A1* | 5/2013 | Chern | H01L 23/5256 257/379 |

* cited by examiner

*Primary Examiner* — Chuong A Luu
*Assistant Examiner* — Rodolfo D Fortich
(74) *Attorney, Agent, or Firm* — Kilpatrick Townsend & Stockton LLP

(57) ABSTRACT

An LDMOS (Laterally-Diffused Metal Oxide Semiconductor) device has a substrate, which includes a first doped region, a second doped region, and a shallow trench isolation (STI) region disposed in the second doped region. The first doped region and the second doped region are adjacent and have different conductivity types. The device also has a gate structure disposed on the substrate; the gate structure substantially does not overlap the second doped region.

20 Claims, 16 Drawing Sheets

FINFET LDMOS DEVICE AND MANUFACTURING METHODS

CROSS-REFERENCES TO RELATED APPLICATIONS

This application claims priority to Chinese patent application No. 201410499784.7, filed on Sep. 26, 2014, the content of which is incorporated herein by reference in its entirety.

BACKGROUND OF THE INVENTION

The present invention relates to the field of semiconductor technology. Specifically, embodiments of the invention are directed to device structures and methods of manufacturing for the LDMOS (Laterally-Diffused Metal Oxide Semiconductor) device.

With the development of the ultra-large scale integrated circuit (ULSI), device size and supply voltage continue to be reduced. In technologies with minimum device dimensions larger than 28 nm, the breakdown voltage of laterally diffused metal oxide semiconductor (LDMOS) devices needs to be greater than 10V. For conventional LDMOS devices, in order to make the breakdown voltage greater than 10 V, shallow trench isolation (STI) structures are often introduced in the active region between the gate and the drain. However, the inventor has discovered that STI structures are not conducive to epitaxially grown recessed STI source/drain structures often used in FinFET (Fin Field Effect Transistor) devices under the 14 nm technology node.

In addition, the inventor has also discovered that, with the further shrinking of device size, dishing effects in the chemical mechanical polishing (CMP) process and micro-loading effects in the epitaxial growth process are becoming serious problems. Typically, the gate length of small devices is limited to less than 0.2 um, but in the LDMOS device, in order to ensure the breakdown voltage is large enough, the gate length is often more than the minimum length, resulting in dishing problems in the CMP process.

BRIEF SUMMARY OF THE INVENTION

Embodiments of the present invention provide novel LDMOS devices and manufacturing processes. In some embodiments, device structures and methods for FinFET LDMOS devices are provided. In alternative embodiments, device structures and methods for planar LDMOS devices are provided. In various embodiments, dummy gate structures are included in the LDMOS, which can reduce CMP dishing, and can also reduce micro-loading effects in epitaxial growth of the source and drain regions.

According to some embodiments of the present invention, an LDMOS (Laterally-Diffused Metal Oxide Semiconductor) device has a substrate, which includes a first doped region, a second doped region, and a shallow trench isolation (STI) region disposed in the second doped region. The first doped region and the second doped region are adjacent and have different conductivity types. The device also has a gate structure disposed on the substrate; the gate structure substantially does not overlap the second doped region.

In an embodiment, the above device also includes a source region formed in the first doped region and a drain region formed in the second doped region. The STI region is disposed in the second doped region between the gate structure and the drain region.

In some embodiments, the device also includes a first fin structure that includes a portion of the first doped region and a first portion of the second doped region, and a second fin structure that includes a second portion of the second doped region. The STI region is disposed in the second doped region between the first fin structure and the second fin structure. The gate structure is configured to overlie the first fin structure, and the gate structure substantially does not overlap with the first portion of the second doped region of the fin structure. In an embodiment, the device also includes a source region in the first fin structure and a drain region in the second fin structure. In an embodiment, the device also has one or more dummy gate structures between the gate structure and the drain region. In an embodiment, at least one of the dummy gates overlaps with the drain region. In an embodiment, at least one of the dummy gates overlaps with the source region. In an embodiment, the density of the dummy gate structures is 5 to 30%.

According to some embodiments of the present invention, a method for forming an LDMOS (Laterally-Diffused Metal Oxide Semiconductor) device includes providing a substrate, which has a first doped region, a second doped region, and a shallow trench isolation (STI) region disposed in the second doped region. The first doped region and the second doped region are adjacent and have different conductivity types. The method also includes forming a gate structure disposed on the substrate; the gate structure substantially does not overlap the second doped region.

In some embodiments, the method also includes forming a source region in the first doped region, and forming a drain region in the second doped region. The STI region is disposed in the second doped region between the gate structure and the drain region.

In some embodiments, the method also includes forming a first fin structure that includes a portion of the first doped region and a first portion of the second doped region, and forming a second fin structure that includes a second portion of the second doped region. The STI region is disposed in the second doped region between the first fin structure and the second fin structure. The gate structure is configured to overlie the first fin structure, and the gate structure substantially does not overlap with the first portion of the second doped region of the fin structure. In some embodiments, the method also includes forming a source region in the first fin structure and forming a drain region in the second fin structure. In some embodiments, the method also includes forming one or more dummy gate structures between the gate structure and the drain region. In some embodiments, at least one of the dummy gates overlaps with the drain region. In some embodiments, at least one of the dummy gates overlaps with the source region. In some embodiments, the length of each of the dummy gate structures is between 0.01 to 0.1 um, and the density of the dummy gate structures is 5 to 30%.

According to some embodiments, an LDMOS (Laterally-Diffused Metal Oxide Semiconductor) device has a substrate, which includes a first doped region and a second doped region. The first doped region and the second doped region are adjacent and have different conductivity types. The device also has a gate structure disposed on the substrate, a source region disposed in the first doped region, and a drain region disposed in the second doped region. The device also has a shallow trench isolation (STI) region disposed in the second doped region, and one or more dummy gate structures disposed between the gate structure and the drain region.

In some embodiments, the device also includes a first fin structure that includes a portion of the first doped region and a first portion of the second doped region, and a second fin structure that includes a second portion of the second doped region. The STI region is disposed in the second doped region between the first fin structure and the second fin structure. The gate structure is configured to overlie the first fin structure, the source region is formed in the first fin structure, and the drain region is formed in the second fin structure. In some embodiments, the device also includes a dummy gate structure that overlaps with the drain region.

The following description, together with the accompanying drawings, will provide further understanding of the nature and advantages of the claimed invention.

DETAILED DESCRIPTION OF THE INVENTION

Figure 1:
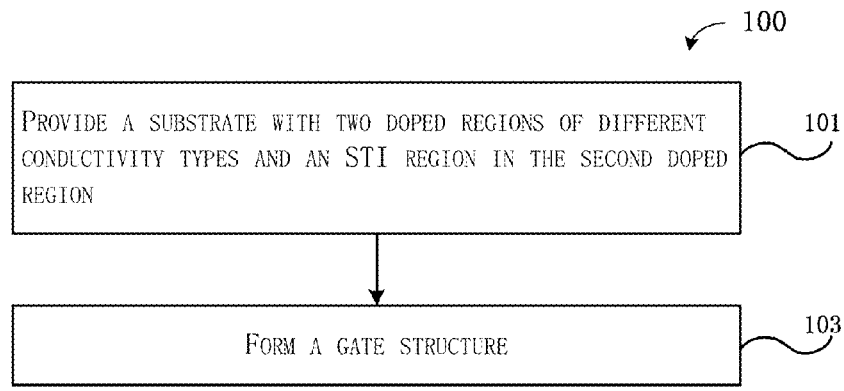
FIG. 1 is a simplified flow chart of a method for manufacturing an LDMOS device according to an embodiment of the present invention.

Exemplary embodiments of the present invention will be described with reference to the figures. The following description of exemplary embodiments is illustrative only, and not intended to be any limitation on the invention and its application or use. It is understood that the relative arrangement of parts and steps and numeric expressions set forth in these embodiments are not to be construed as limiting the scope of the invention. It is also understood that, for convenience of description, the sizes of the various components shown in the drawings are not necessarily drawn to actual proportional relationship. Techniques, methods and devices known to one of ordinary skill in the relevant art may not be discussed in detail, but in situations in which these techniques, methods and apparatus apply, these techniques, methods and apparatus should be considered as part of this specification. Further, similar reference numerals and letters are used to refer to similar items in the following figures, and once an item is defined in one of the figures, it will not need to be explained further in the subsequent figures.

FIG. 1 is a simplified flow chart of a method for manufacturing an LDMOS device according to an embodiment of the present invention. As shown in FIG. 1, method 100 can be summarized as follows.

Step 101: Provide a substrate having two doped regions with different conductivity types and an STI region; and Step 103: Form a gate structure, that can include dummy gate structures.

Figure 2:
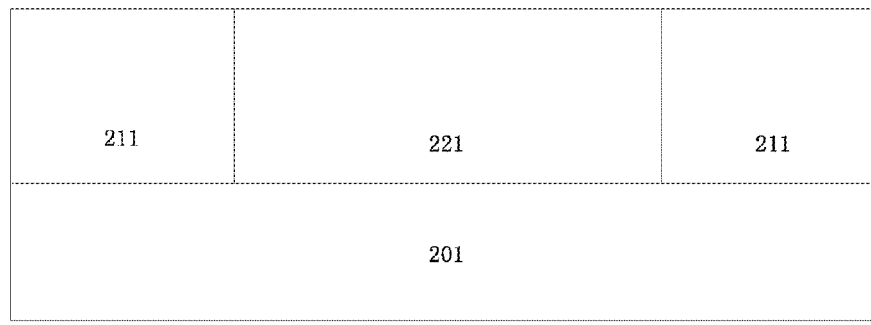
FIGS. 2-22 are cross sectional view diagrams illustrating a method for manufacturing a FinFET LDMOS device according to embodiments of the present invention.

Method 100 is now explained with reference to the cross-section diagrams in FIGS. 2-22. As shown in FIG. 2, dopants are introduced in substrate 201 to form a first doped region 211 and a second doped region 221. In some embodiments, first doped region 211 is P-type and second doped region 221 is N-type. In some alternative embodiments, the dopant types can be reversed. For example, first doped region 211 can be N-type and second doped region 221 can be P-type.

Figure 3A:
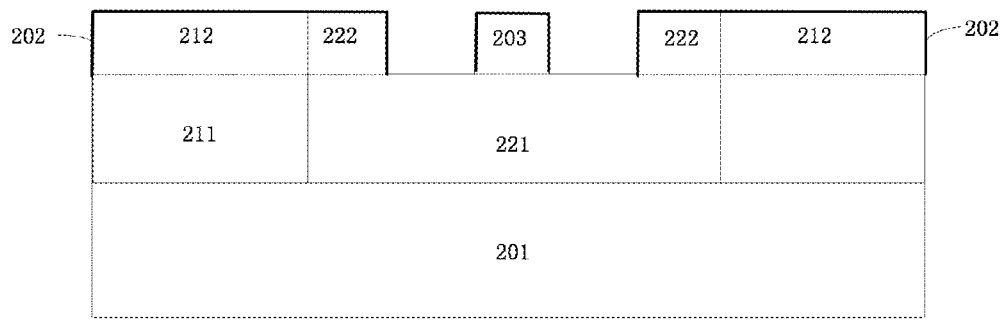
Figure 3B:
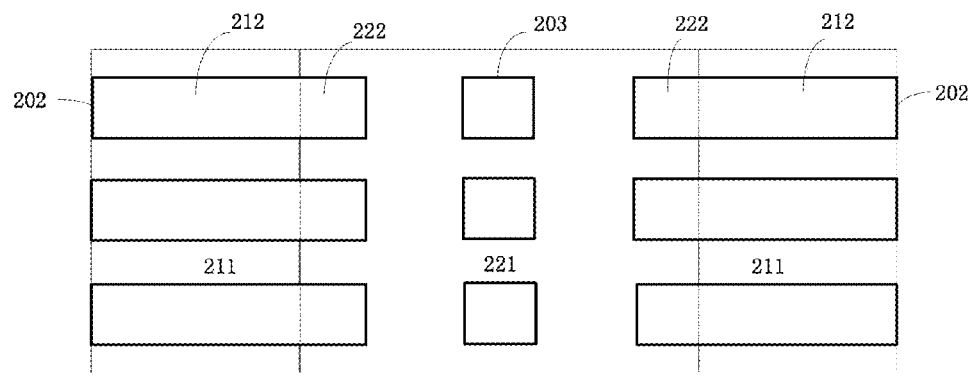

Next, as shown in the cross-sectional view in FIG. 3A, the substrate is patterned, e.g., by photolithography and dry etching, to form first fin structures 202 and second fin structures 203. As shown in the top layout view in FIG. 3B, there are plurality of parallel rows of fin structures. Each row of fin structures includes two first fin structures 202 and a second fin structure 203. In each row, second fin structure 203 is separated from two first fin structures 202 on each side by two portions of second doped region 221. Further, first fin structure 202 includes a first doped fin region 212, which is a portion of doped region 211 of the substrate, and a second doped fin region 222, which is part of doped region 221. Second fin structure 203 includes a portion of second doped region 221 of the substrate.

Figure 4:
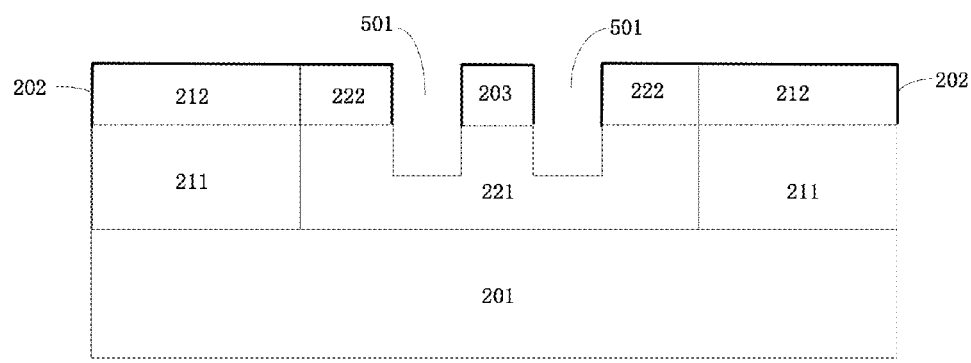
Figure 5A:
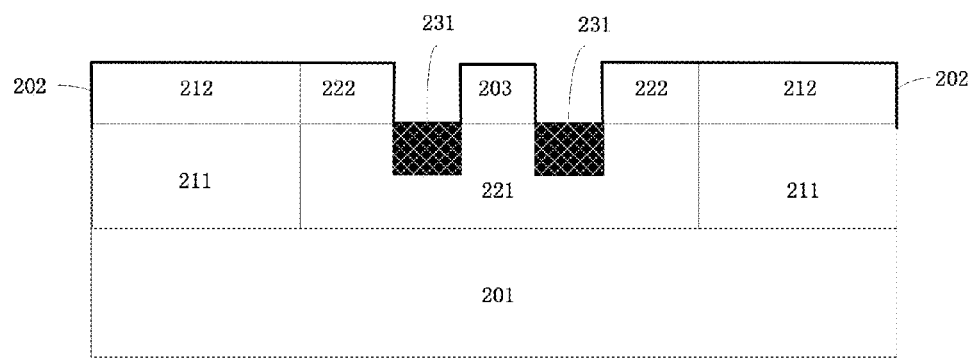

In FIG. 4, the portions of second doped region 221 separating fin structures 202 and 203 are etched to form trenches 501. In FIG. 5A, trenches 501 are partially filled to form shallow trench isolation regions 231. In some embodiments, trenches 501 can first be filled with a dielectric, e.g., oxide, planarized using CMP, and then partially etched back. The structure shown in FIG. 5A is referred to as a substrate structure.

Figure 5B:
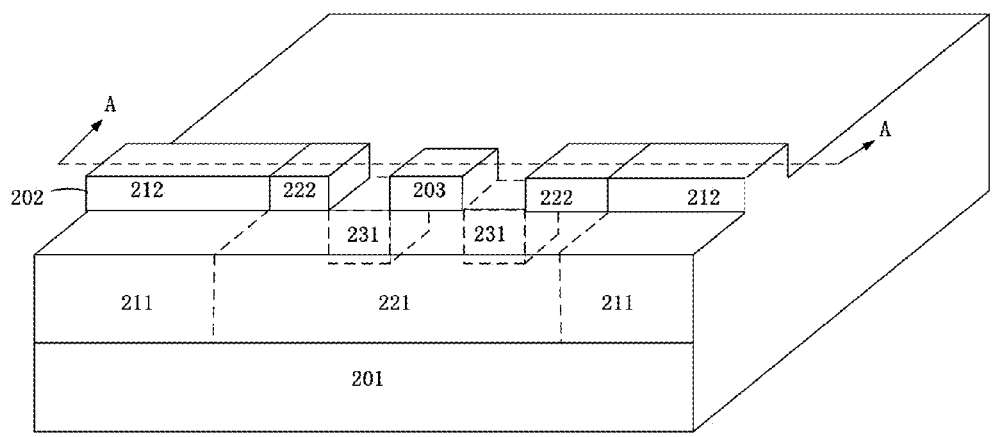

FIGS. 5A and 5B show a cross-sectional view and a perspective view of a substrate structure according to an embodiment of the present invention. As shown in FIGS. 5A and 5B, first fin structure 202 and second fin structure 203 are formed in substrate 201. First fin structure 202 includes a first doped fin region 212, which is a portion of doped region 211 of the substrate, and a second doped fin region 222, which is part of doped region 221. Second fin structure 203 includes a portion of second doped region 221 of the substrate. Further, STI region 231 is formed in second doped region 221 of the substrate, between first fin structure 202 and second fin structure 203.

It is noted that, the cross-sectional views of the FinFET LDMOS are taken along the AA direction as shown in FIG. 5B. Further, first fin structure 202 and second fin structure 203 are formed from part of the substrate and therefore, in subsequent cross-sectional views, the bottom surfaces of fin structures 202 and 203 are shown in dotted lines for illustration purposes.

Figure 6:
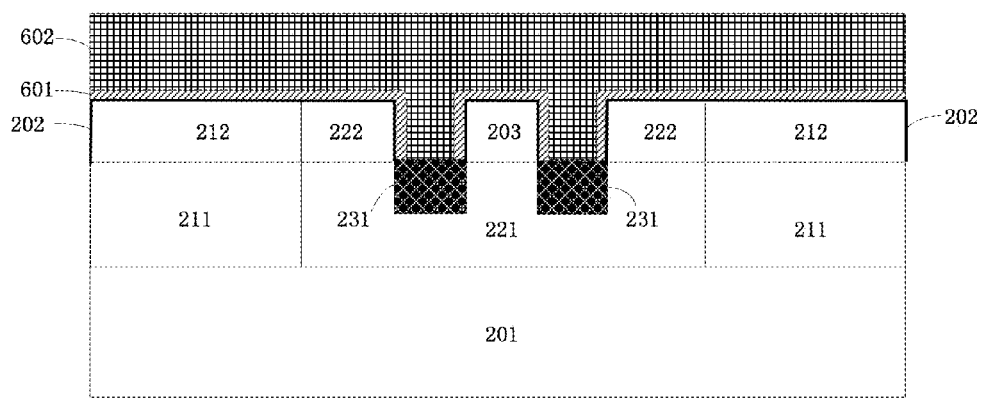
Figure 7A:
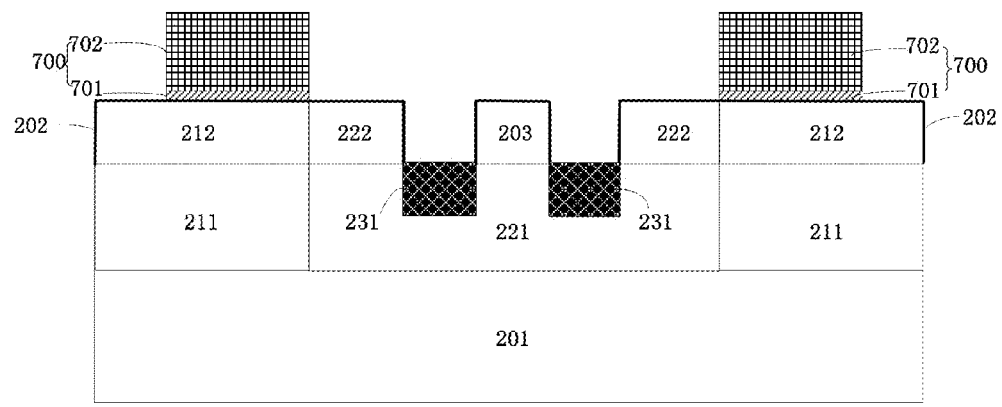
Figure 7B:
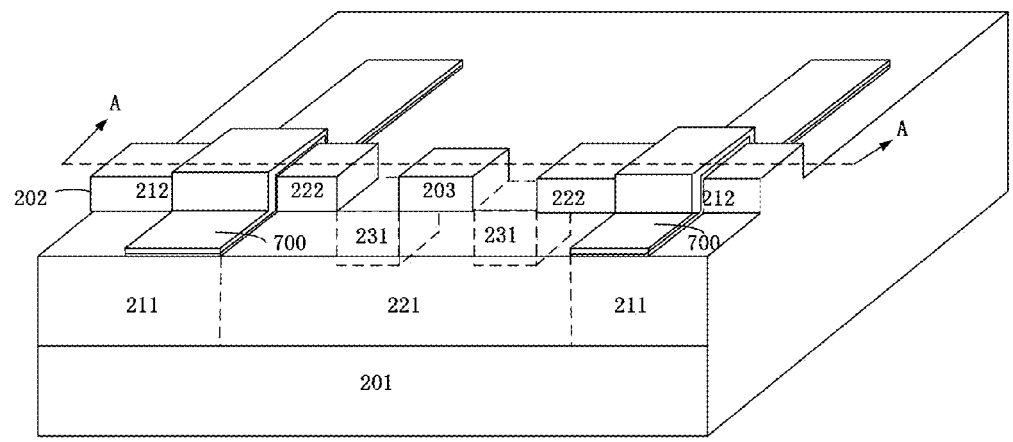

Step 103 of method 100 is now explained with reference to FIGS. 6-11. As shown in FIG. 6, a dielectric layer 601 is formed on the substrate structure of FIG. 5B, and a gate material layer 602 is formed on dielectric layer 601. In an example, dielectric layer 601 can be silicon oxide, and gate material layer 602 can be polysilicon. Next, as shown in FIGS. 7A and 7B, dielectric layer 601 and gate material layer 60 are patterned to from a gate structure 700, which includes a gate 702 and oxide 701 under the gate. Gate structure 700 overlies a portion of first doped region 212 of first fin structure 202 and substantially does not overlap doped region 221 of the substrate. It is noted that the gate structures shown in FIGS. 7A and 7B are merely exemplary embodiments and, in some other embodiments, the gate structure and the second doped region may have a slight overlap, preferably, less than 50 nm. In contrast, in conventional devices, there is often a significant overlap between the gate structure and the STI structure and the well region in which the STI structure is disposed.

Figure 8:
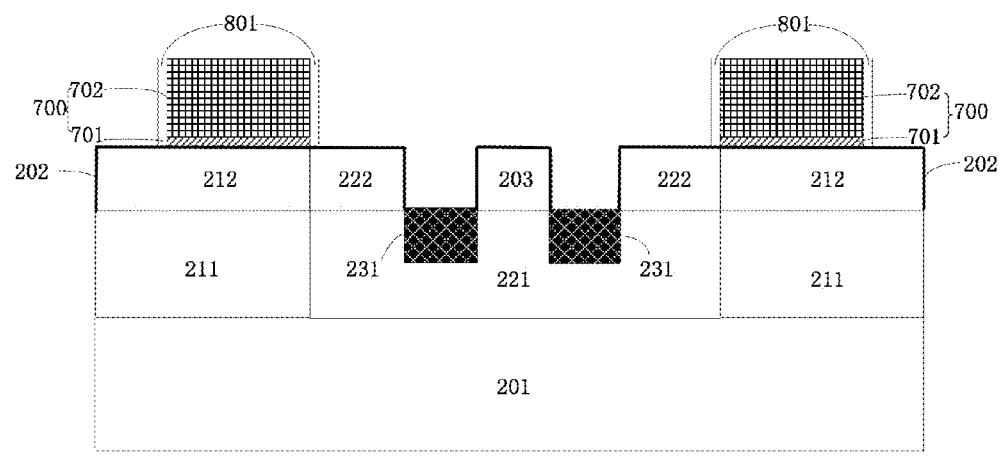

It will be appreciated that gate structure 700 may also include a spacer 801 formed at both sides of the gate structure, as shown in FIG. 8. In some examples, spacers described herein may be silicon oxide or silicon nitride, etc., but are not limited to these materials. It will also be understood that the gate structure may be replaced by a metal gate structure in a subsequent step.

It is noted that the term "across" used herein, for example, a gate structure disposed across the fin structure (e.g., a first/second fin structure) of the gate structure, refers to the gate structure overlying a portion of the upper surface and side surfaces of the fin structure and the gate structure is also formed on part of the surface of the substrate adjacent to the fin structure. This explanation also applies to the dummy gate structure across the fin structure discussed below.

Figure 9:
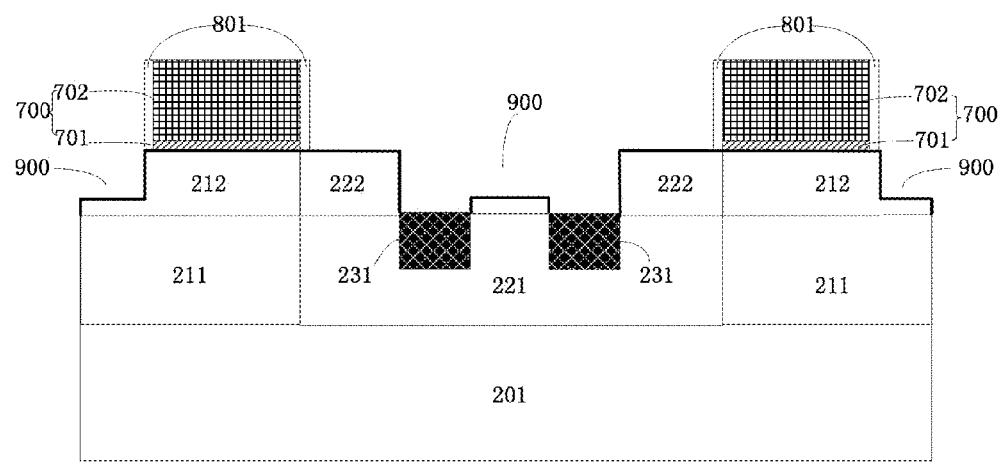
Figure 10:
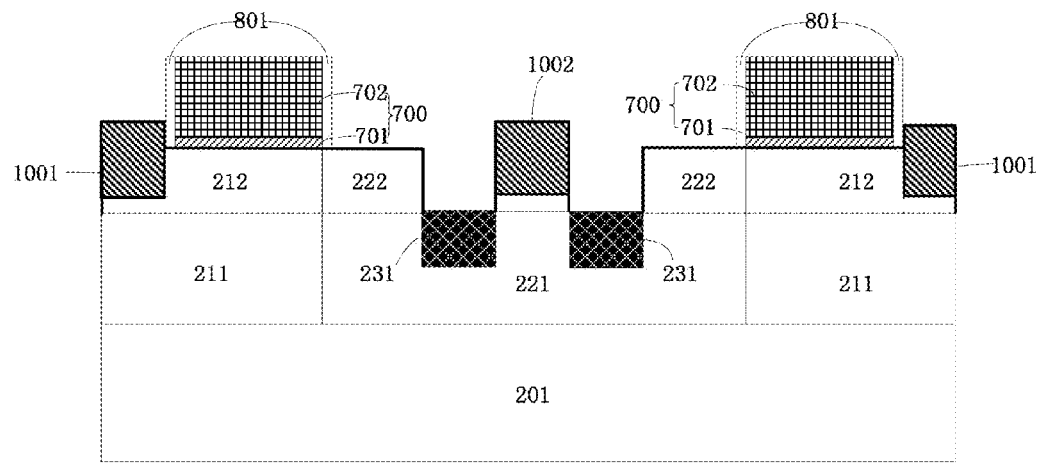

In some embodiments, source and drain regions are formed after forming the gate structure. As shown in FIG. 9, recess regions 900 are formed by removing part of first doped fin region 212 and part of second fin structure 203. Next, as shown in FIG. 10, epitaxial growth of semiconductor materials is carried out in recess regions 900 to form a source region 1001 and drain region 1002, respectively. Here, the upper surface of the epitaxial growth of the semiconductor material can be above the upper surfaces of the first and second fin structures. In this case, raised source and drain regions are formed. Suitable semiconductor materials can be selected for the source and drain regions according to device types. For example, for a P-type LDMOS device, SiGe can be used; for an N-type LDMOS device, SiC or Si can be used. In some embodiments, the epitaxial layer can be doped in-situ. In other embodiments, the epitaxial regions can be doped by ion implantation.

Figure 11:
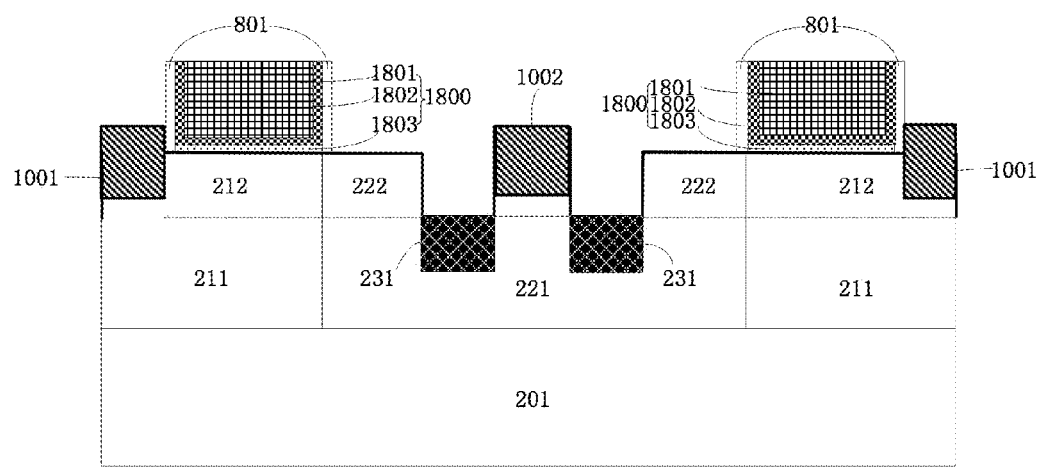

Next, as shown in FIG. 11, gate structure 700 can be removed and replaced with a metal gate structure. For example, dielectric 701 and gate 702 are removed, but spacers 801 are retained. An interface layer 1803, e.g., silicon oxide, is formed on the first fin structure. Then, a high K dielectric layer 1802 is formed inside spacers 801. A metal gate material is formed and a planarization process can be carried out using CMP. Before the metal gate material is formed, a dielectric layer can be formed. As shown in FIG. 11, metal gate structure 1800 includes a metal gate 1801 (also referred to as a metal gate electrode) and high K dielectric layer 1802. Due to the reduced size of the gate structure, the dishing problem during CMP is reduced.

Figure 12:
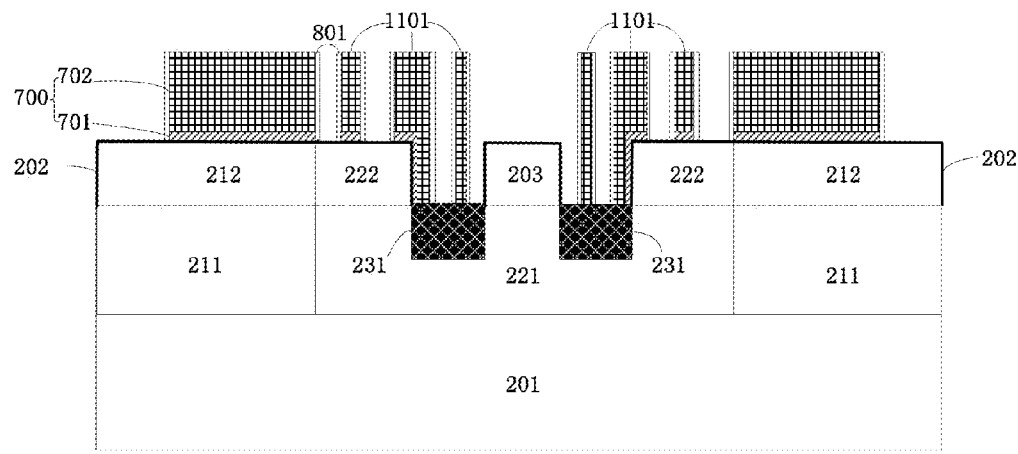
Figure 13:
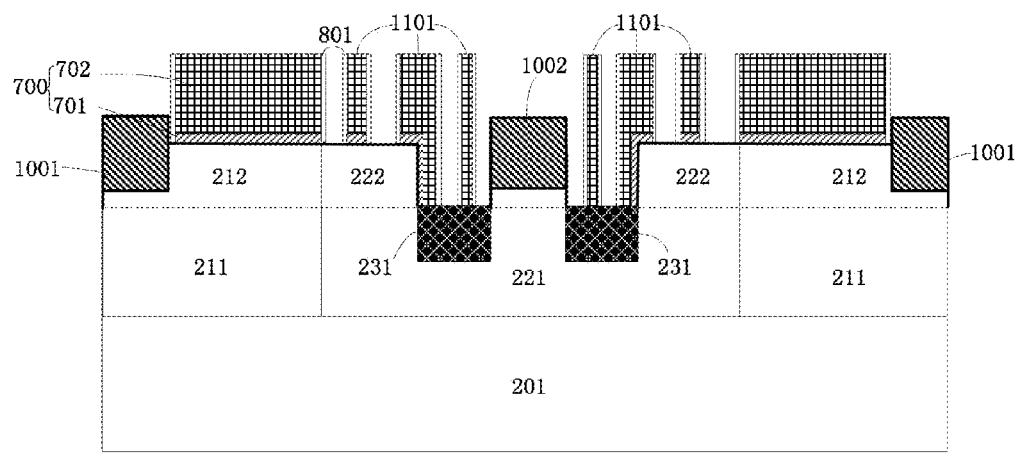

In some embodiments, as shown in FIG. 12, step 103 in method 100 for forming the FinFET LDMOS device can also include forming dummy gate structures 1101 between second fin structure 203 and gate structure 700. Dummy gate structures 1101 can also include spacers 801 at both sidewalls of the gate structure. In the example of FIG. 12, there are three dummy gate structures 1101. However, more than three dummy gate structures can also be formed to alleviate the dishing problems in CMP. For example, one or more dummy gate structures can be disposed across doped region 222 of first fin structure 202, or can be disposed over STI region 231. FIG. 13 shows that source and drain regions 1001 and 1002 are formed after dummy gate structures are formed in FIG. 12. In embodiments of the invention, the dummy structures can alleviate dishing problems in CMP even if gate structure 700 is not reduced, i.e., if an overlap region exists between gate structure 700 and second doped region 222.

Figure 14:
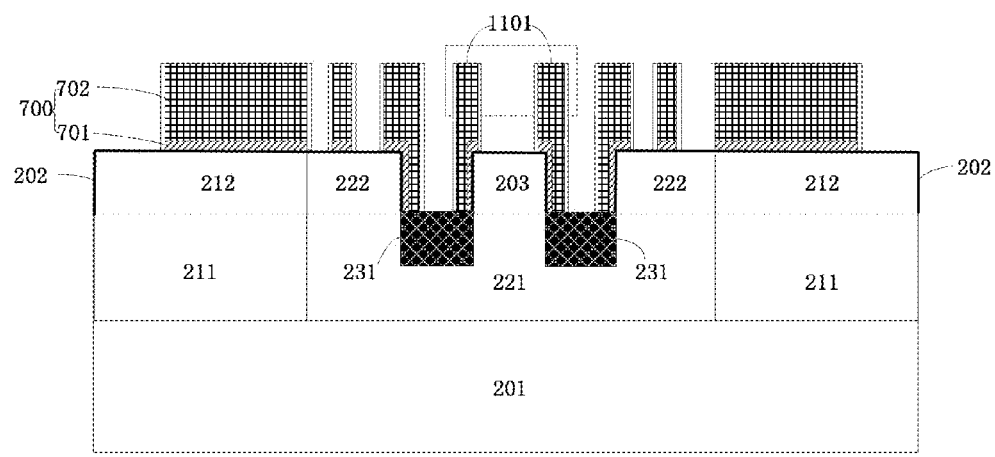
Figure 15:
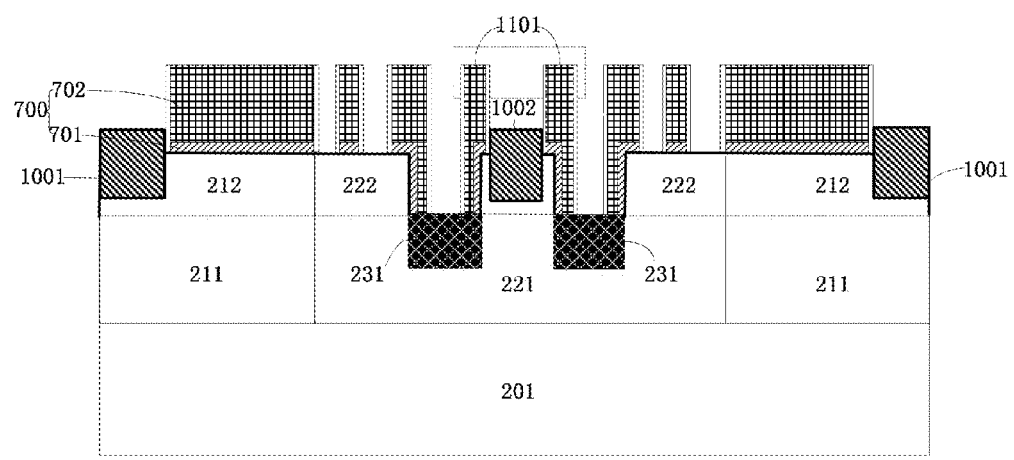

FIG. 14 shows two dummy gate structures 1101 (encircled by the dotted rectangle) that overlap with second fin structure 203 according to some embodiments of the invention. FIG. 15 shows the source and drain regions 1001 and 1002. It is noted that the drain region in FIG. 15 is narrower than the drain regions in FIGS. 11 and 13. Thus, this method can not only reduce CMP dishing; it can also reduce micro-loading effect in epitaxial growth of the source and drain regions.

Figure 16:
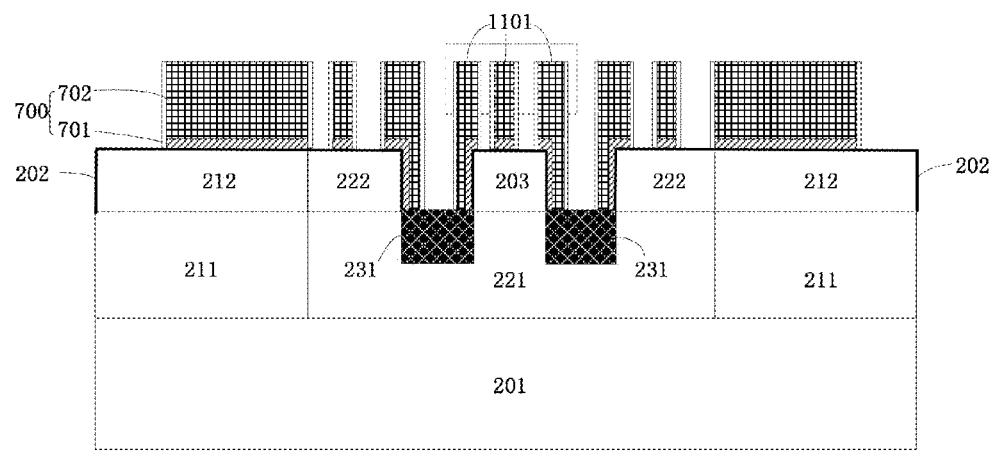
Figure 17:
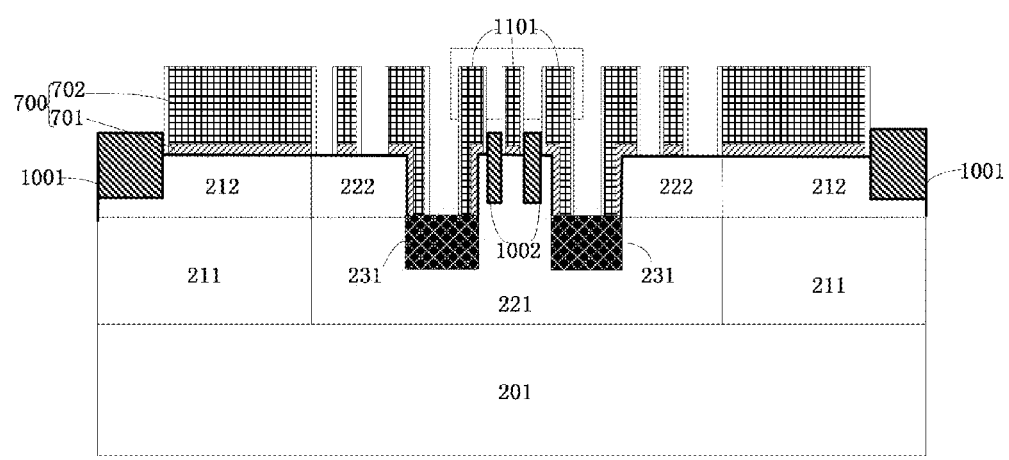

In some embodiments, as shown in FIG. 16, one or more dummy gate structures 1101 (encircled by the dotted rect-angle) can be disposed across the second fin structure 203. As shown in FIG. 17, drain regions 1002 are formed between dummy gate structures 1101.

Figure 18:
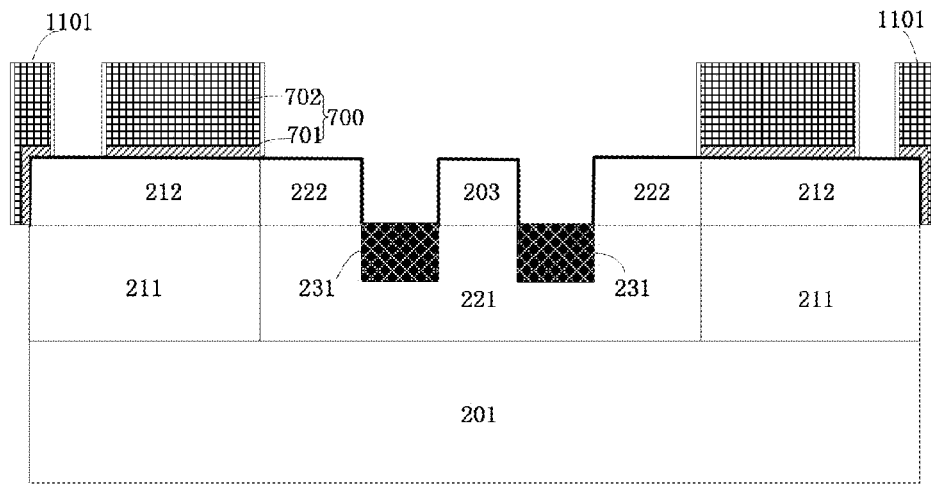
Figure 19:
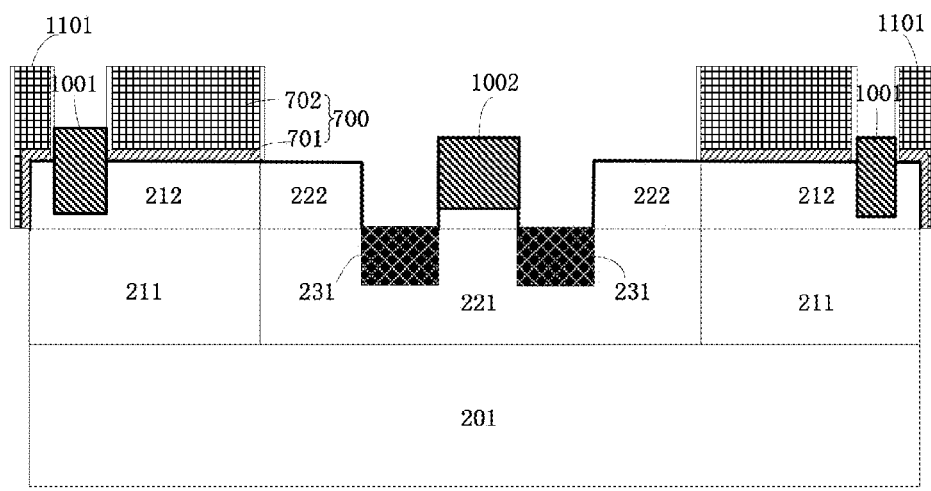
Figure 20:
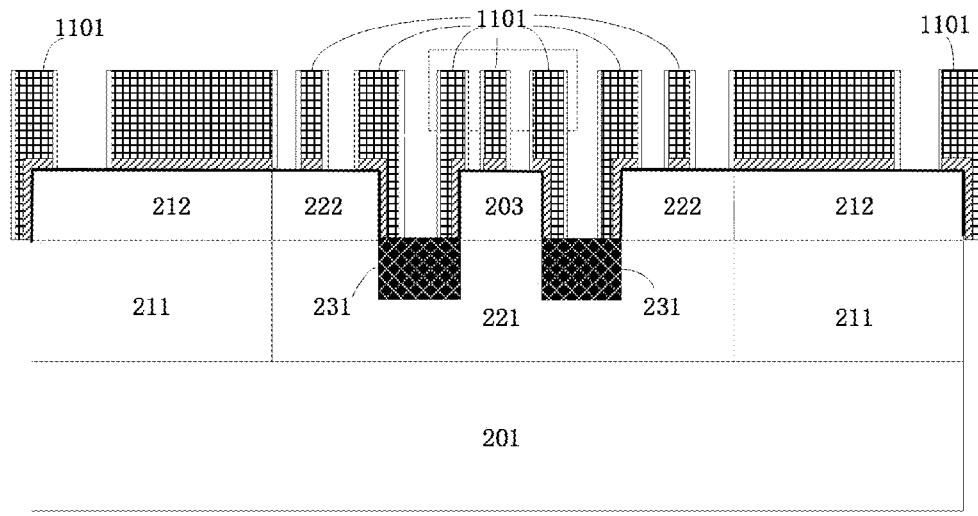
Figure 21:
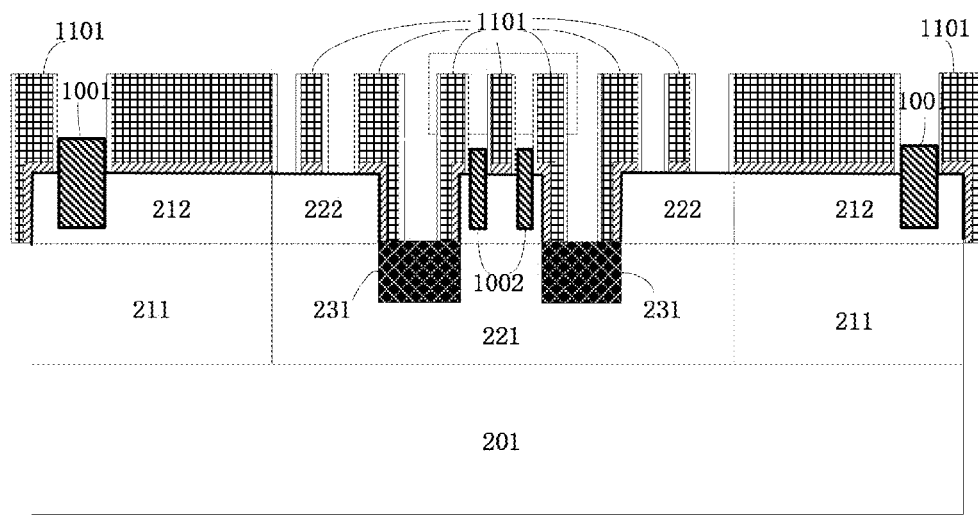
Figure 22:
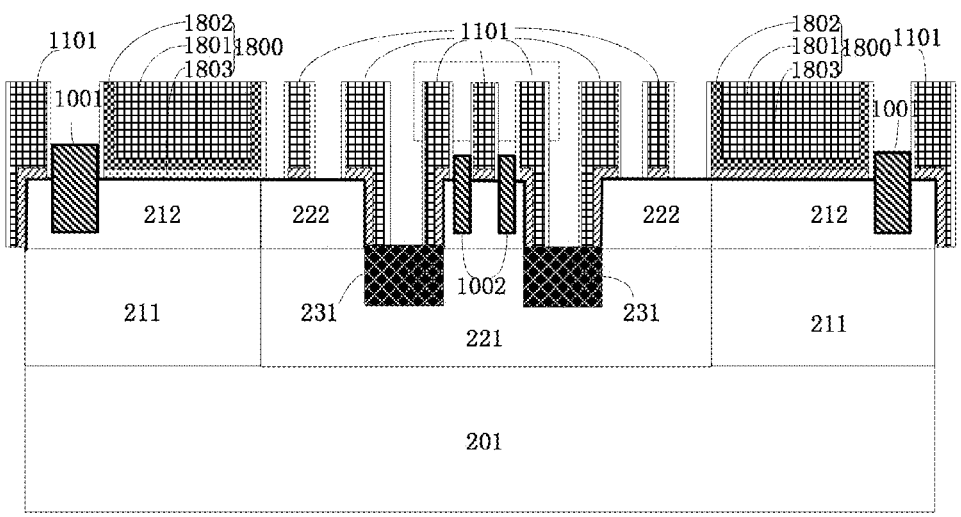

In some embodiments, as shown in FIG. 18, step 103 in method 100 for forming gate structures 700 can also include forming dummy gate structures 1101 that overlap a portion of first fin structure 202. As described above, dummy gate structures 1101 can also include spacers. FIG. 19 shows that source and drain regions 1001 and 1002 are formed on the structure of FIG. 18. FIGS. 20 and 21 show alternative embodiments of the formation of dummy gates and source drain regions. In some embodiments, the dummy gate structures can be replaced with metal gate structures. In some embodiments, the gate structure and dummy gate structures can be replaced with metal gate structures in the same process. Thus, various embodiments of this method can not only reduce CMP dishing, they can also reduce microloading effect in epitaxial growth of the source and drain regions. It is noted that, in some embodiments, before the removal of the gate and dummy gate structures, the method can also include forming interlayer dielectric (ILD) and performing CMP (not shown in the figures).

FIGS. 23-30 are cross-sectional view diagrams illustrating a method of manufacturing a planar LDMOS device according to embodiments of the invention. The method includes certain steps similar to the steps of forming the FinFET LDMOS device described above. Therefore, the description will be brief.

Figure 23:
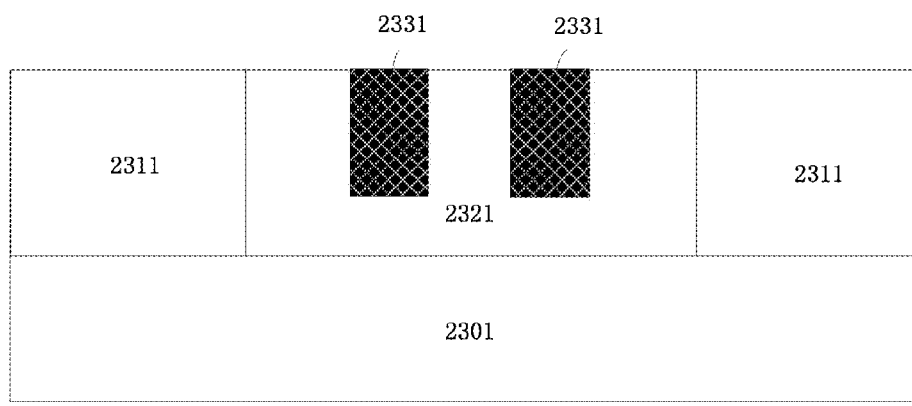
FIGS. 23-30 are cross sectional view diagrams illustrating a method for manufacturing a planar LDMOS device according to alternative embodiments of the present invention.

FIG. 23 shows a substrate 2301 that includes a first doped region 2311 and second doped region 2321, which have different doping types. Trenches 2331 are formed in second doped region 2321, and the surface of trenches is planar to the substrate 2301.

Figure 24:
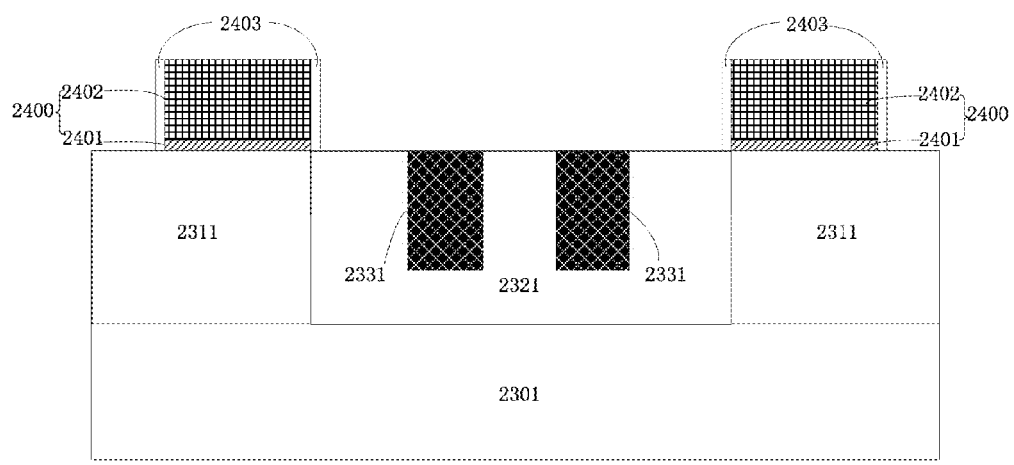

In FIG. 24, gate structures 2400 are formed over first doped region 2311. Gate structures 2400 include gate oxide 2401 and gate electrode 2402. Here, there is substantially no overlap between gate structure 2400 and second doped region 2321. In some embodiments, the overlap is less than 50 nm. Further, the gate structure can also include spacers 2403.

Figure 25:
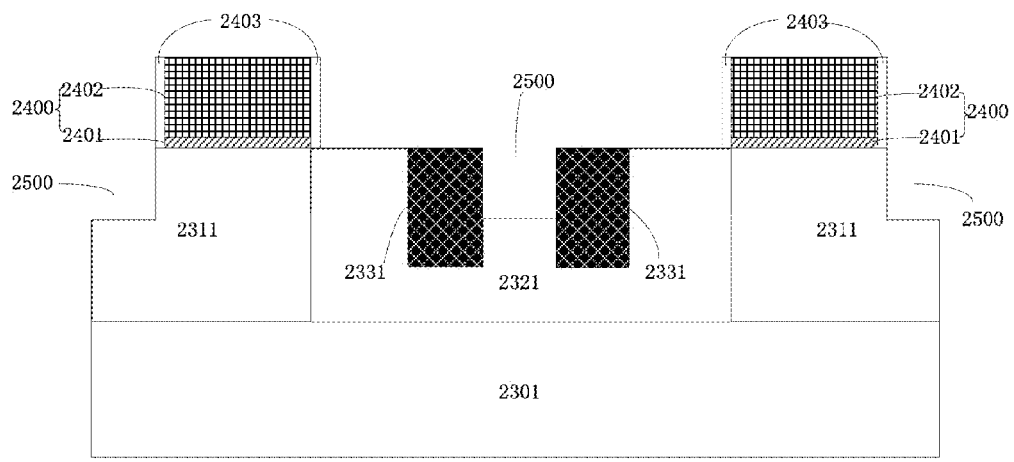
Figure 26:
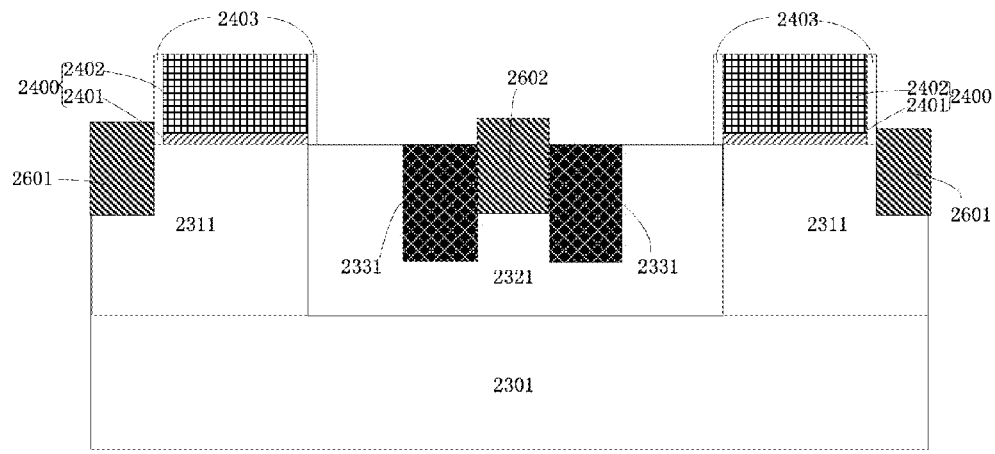
Figure 27:
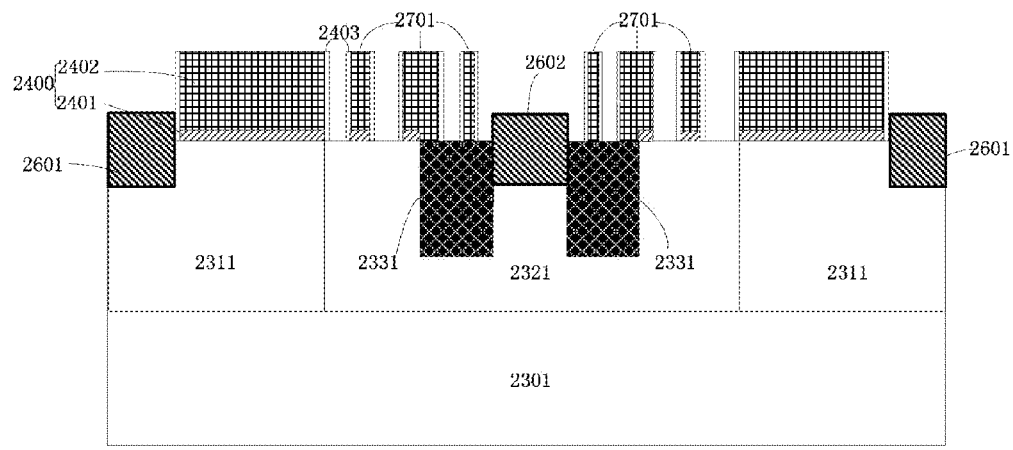
Figure 28:
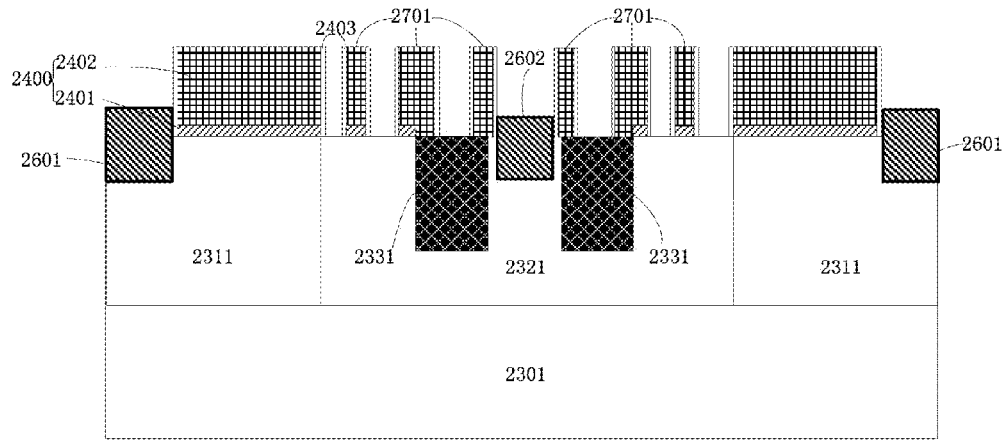
Figure 29:
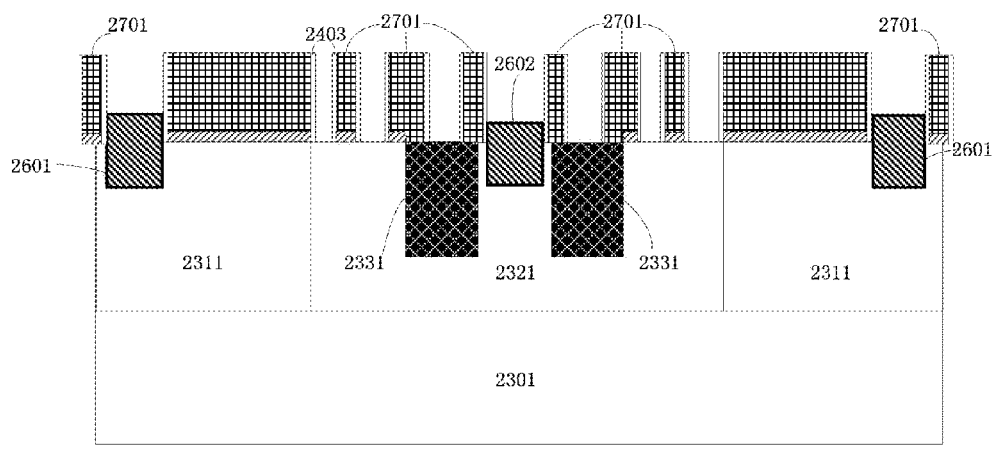

In FIG. 25, the doped regions are etched to form recess regions 2500. Then, in FIG. 26, raised source 2601 and drain 2602 regions are formed by epitaxial growth. In FIG. 27, dummy gate structures 2701 can be formed between the gate structure and the drain region. FIG. 28 shows that some dummy gate structures can overlap the drain region, and FIG. 29 shows that some dummy gate structures can overlap the source region.

Figure 30:
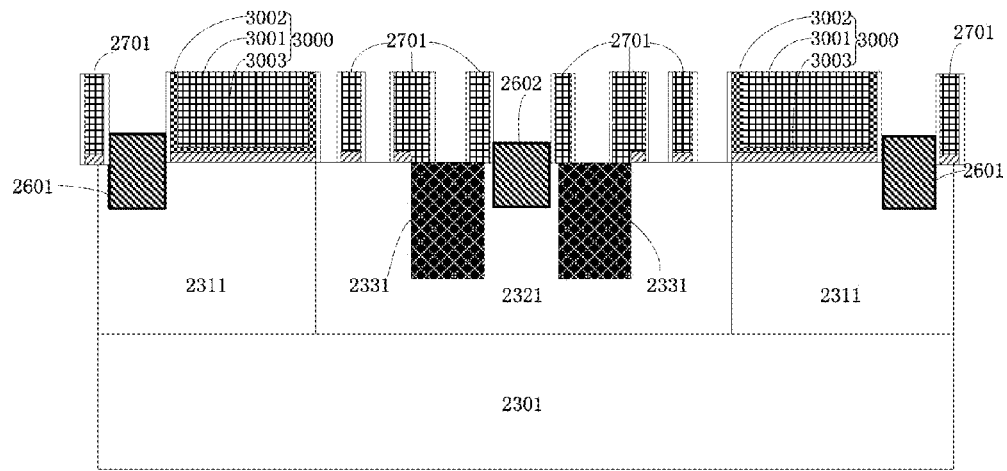

FIG. 30 shows that the initial gate structure can be replaced by a metal gate structure 3000, which includes metal gate electrode 3001, high K dielectric layer 3002, and interface layer 3003. In some embodiments, the length of the dummy gate structures can be 0.01 to 0.1 um, and the density of the dummy gate structures can be 5 to 30%.

LDMOS device structures and manufacturing methods are described above according to some embodiments of the present invention. In order to simplify the description, some well-known details are simplified or omitted. Those skilled in the art can understand how to implement the technical solutions based on the materials disclosed herein.

Although certain embodiments of the present invention are described in detail, those skilled in the art will appreciate that the above examples are for illustration only and not to limit the scope of the invention. Thus, those skilled in the art would appreciate that, aside from embodiments of the present disclosure, various modifications and changes can be made without departing from the spirit and scope of the present disclosure.

What is claimed is:

1. An LDMOS (Laterally-Diffused Metal Oxide Semiconductor) device, comprising:
   a substrate, said substrate having:
   a first doped region;
   a second doped region; and
   a shallow trench isolation (STI) region disposed in the second doped region;
   wherein the first doped region and the second doped region are adjacent and have different conductivity types;
   a first fin structure comprising a portion of the first doped region and a first portion of the second doped region;
   a second fin structure comprising a second portion of the second doped region; and
   a gate structure on the first fin structure, wherein the gate structure substantially does not overlap with the first portion of the second doped region of the first fin structure.

2. The device of claim 1, further comprising:
   a source region formed in the first doped region; and
   a drain region formed in the second doped region;
   wherein the STI region is disposed between the gate structure and the drain region.

3. The device of claim 1,
   wherein the STI region is disposed between the first fin structure and the second fin structure.

4. The device of claim 1, further comprising:
   a source region in the first fin structure; and
   a drain region in the second fin structure.

5. The device of claim 4, further comprising one or more dummy gate structures between the gate structure and the drain region.

6. The device of claim 5, wherein at least one of the dummy gates overlaps with the drain region.

7. The device of claim 6, wherein at least one of the dummy gates overlaps with the source region.

8. The device of claim 5, wherein each of the dummy gate structures includes a dummy gate electrode and a dummy gate dielectric.

9. The device of claim 5, wherein the length of each of the dummy gate structures is between 0.01 to 0.1 um, and the density of the dummy gate structures is 5 to 30%.

10. A method for forming an LDMOS (Laterally-Diffused Metal Oxide Semiconductor) device, comprising:
    providing a substrate, said substrate having:
    a first doped region;
    a second doped region; and
    a shallow trench isolation (STI) region disposed in the second doped region;
    wherein the first doped region and the second doped region are adjacent and have different conductivity types;
    forming a first fin structure comprising a portion of the first doped region and a first portion of the second doped region;
    forming a second fin structure comprising a second portion of the second doped region; and
    forming a gate structure on the first fin structure, wherein the gate structure substantially does not overlap with the first portion of the second doped region of the first fin structure.

11. The method of claim 10, further comprising:
    forming a source region in the first doped region; and
    forming a drain region in the second doped region;
    wherein the STI region is disposed between the gate structure and the drain region.

12. The method of claim 10,
    wherein the STI region is disposed between the first fin structure and the second fin structure.

13. The method of claim 10, further comprising:
    forming a source region in the first fin structure; and
    forming a drain region in the second fin structure.

14. The method of claim 13, further comprising forming one or more dummy gate structures between the gate structure and the drain region.

15. The method of claim 14, wherein at least one of the dummy gates overlaps with the drain region.

16. The method of claim 15, wherein at least one of the dummy gates overlaps with the source region.

17. The method of claim 14, wherein the length of each of the dummy gate structures is between 0.01 to 0.1 um, and the density of the dummy gate structures is 5 to 30%.

18. An LDMOS (Laterally-Diffused Metal Oxide Semiconductor) device, comprising:
    a substrate, said substrate having:
    a first doped region;
    a second doped region; and
    wherein the first doped region and the second doped region are adjacent and have different conductivity types;
    a source region disposed in the first doped region;
    a drain region disposed in the second doped region;
    a first fin structure comprising a portion of the first doped region and a first portion of the second doped region;
    a second fin structure comprising a second portion of the second doped region;
    a gate structure on the first fin structure;
    a shallow trench isolation (STI) region disposed in the second doped region; and
    one or more dummy gate structures disposed between the gate structure and the drain region.

19. The device of claim 18,
    wherein the STI region is disposed between the first fin structure and the second fin structure;
    the source region is formed in the first fin structure, and the drain region is formed in the second fin structure.

20. The device of claim 19, further including a dummy gate structure that overlaps with the drain region.

* * * * *